US009042191B2

(12) United States Patent
O'Connell

(10) Patent No.: US 9,042,191 B2
(45) Date of Patent: May 26, 2015

(54) SELF-REPAIRING MEMORY

(71) Applicant: Taiwan Semiconductor Manufacturing Company, Ltd., Hsinchu (TW)

(72) Inventor: Cormac Michael O'Connell, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 257 days.

(21) Appl. No.: 13/840,386

(22) Filed: Mar. 15, 2013

(65) Prior Publication Data

US 2013/0212449 A1 Aug. 15, 2013

Related U.S. Application Data

(63) Continuation-in-part of application No. 13/399,993, filed on Feb. 17, 2012, now Pat. No. 8,750,059, which is a continuation-in-part of application No. 12/849,157, filed on Aug. 3, 2010, now abandoned.

(60) Provisional application No. 61/666,771, filed on Jun. 29, 2012, provisional application No. 61/233,387, filed on Aug. 12, 2009.

(51) Int. Cl.
  *G11C 7/00* (2006.01)
  *G06F 11/10* (2006.01)
(52) U.S. Cl.
  CPC ............ *G06F 11/10* (2013.01); *G06F 11/1064* (2013.01)
(58) Field of Classification Search
  CPC ........ G11C 29/00; G11C 29/42; G11C 29/44; G11C 29/52

USPC ............................ 365/200, 201, 235, 185.09
See application file for complete search history.

(56) References Cited

U.S. PATENT DOCUMENTS 5,263,032 A  11/1993  Porter et al.
5,469,388 A  11/1995  Park
(Continued)

FOREIGN PATENT DOCUMENTS

CN  101414489  4/2009
JP  62120557  6/1987
(Continued)

OTHER PUBLICATIONS

Office Action from corresponding application No. CN201010287211.5, Aug. 3, 2012.
Office Action with English Translation from corresponding application No. JP 2010-180734, Jul. 25, 2012.

Primary Examiner — Han Yang
(74) Attorney, Agent, or Firm — Lowe Hauptman & Ham, LLP

(57) ABSTRACT

A memory array has a plurality of rows including a plurality of memory words. Each first bit of a plurality of first bits is associated with a memory word of the each row. A state of the each first bit indicates whether the associated memory word has had an error. Each redundancy row of a plurality of redundancy rows includes a plurality of redundancy words. Each redundancy word is associated with a memory word. A corrected data cache has at least one repair word configured to store corrected data and at least one status bit associated with the at least one repair word, the status bit indicating whether the corrected data stored in the repair word is a pending repair. The corrected data cache is configured to write the corrected data stored in the repair word to at least one of a counterpart memory word or a counterpart redundancy word.

20 Claims, 9 Drawing Sheets

(56) References Cited

U.S. PATENT DOCUMENTS

| | | |
|---|---|---|
| 5,511,164 A | 4/1996 | Brunnmeier et al. |
| 5,701,270 A | 12/1997 | Mohan Rao |
| 6,553,510 B1 | 4/2003 | Pekny |
| 6,560,725 B1 | 5/2003 | Longwell et al. |
| 7,168,010 B2 | 1/2007 | Yadavalli et al. |
| 7,984,329 B2 | 7/2011 | Lastras-Montano et al. |
| 2002/0188897 A1 | 12/2002 | Ruckerbauer et al. |
| 2007/0079184 A1* | 4/2007 | Weiss et al. .................. 714/718 |
| 2009/0285043 A1 | 11/2009 | Nasu et al. |

FOREIGN PATENT DOCUMENTS

| | | |
|---|---|---|
| JP | 1036352 | 2/1989 |
| JP | 8007596 | 1/1996 |
| JP | 8031196 | 2/1996 |
| JP | 2008130221 | 6/2008 |
| JP | 2008186460 | 8/2008 |
| TW | 200823909 | 6/2008 |

* cited by examiner

SELF-REPAIRING MEMORY

CROSS-REFERENCE TO RELATED APPLICATIONS

The present application claims the priority of U.S. Provisional Application No. 61/666,771, filed Jun. 29, 2012, and is a Continuation-in-Part of U.S. application Ser. No. 13/399,993, filed Feb. 17, 2012, which in turn is a Continuation-in-Part of U.S. application Ser. No. 12/849,157, filed Aug. 3, 2010, which in turn claims the priority of U.S. Provisional Application No. 61/233,387, filed Aug. 12, 2009, which are incorporated herein by reference in their entireties.

BACKGROUND

In some instances, information read from a memory array contains errors. Some errors are the result of imperfections in circuitry of the memory array. Some errors are random results that occur during signal processing. In either case, in order for components which use the memory array to function properly, the errors must be corrected. In some existing approaches, when an error occurs at a memory location of an embedded memory, a human being, such as a system engineer, needs to go through some processes to have the error repaired.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
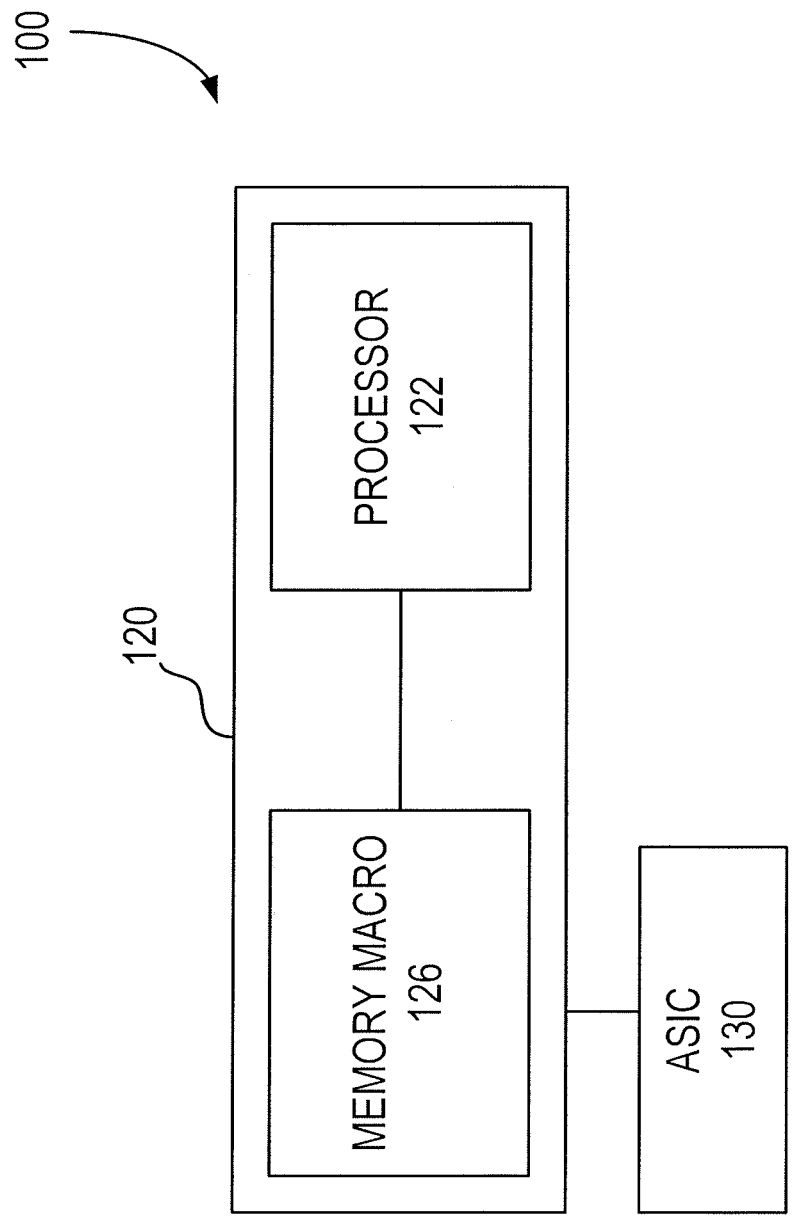
FIG. 1 is a block diagram of a system having a memory macro in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a memory self-repair process for a hard error or a soft error is performed on-the-fly, and the memory is suitable for performing one or more subsequent memory access operations after identification of the hard error or the soft error, but prior to the completion of the memory self-repair process. In some embodiments, No external memory is used during the self-repair process. In some embodiments, a memory self-repair process completes within one no-operation (NOP) instruction cycle. In some embodiments, the self-repair is performed during the system execution of a NOP instruction. In some embodiments, the self-repair is performed during a system reading, writing or refresh function. As a result, no extra external system operation is used by the memory self-repair.

Exemplary System

FIG. 1 is a block diagram of a system 100 in accordance with some embodiments. System 100 includes a system-on-chip (SoC) 120 and an application specific integrated circuit (ASIC) 130 external to SoC 120. In some embodiments, system 100 also includes other electrical components, which are not depicted in FIG. 1. In some embodiments, system 100 functions as a network router, a network switch, a mobile device, or a computer, or a sub-system thereof.

SoC 120 includes a processor 122 and a memory macro 126. In some embodiments, processor 122 is a central processing unit (CPU), a digital signal processor (DSP), or a core logic circuit configured to perform one or more predetermined tasks. In some embodiments, memory macro 126 is a storage unit including a volatile memory device, such as dynamic random access memory (DRAM) or static random access memory (SRAM), a non-volatile memory device, such as flash memory, one time program (OTP) memory, or multi time program (MTP), or a combination thereof. In some embodiments, SoC 120 further includes an input-output (IO) controller, a network interface, or one or more digital or analog circuits.

ASIC 130 includes a specific application design, which, in some embodiments, includes a network processing unit (NPU), a power management unit, a coding/decoding unit, etc. In some embodiments, ASIC 130 is omitted.

Memory Macro

Figure 2:
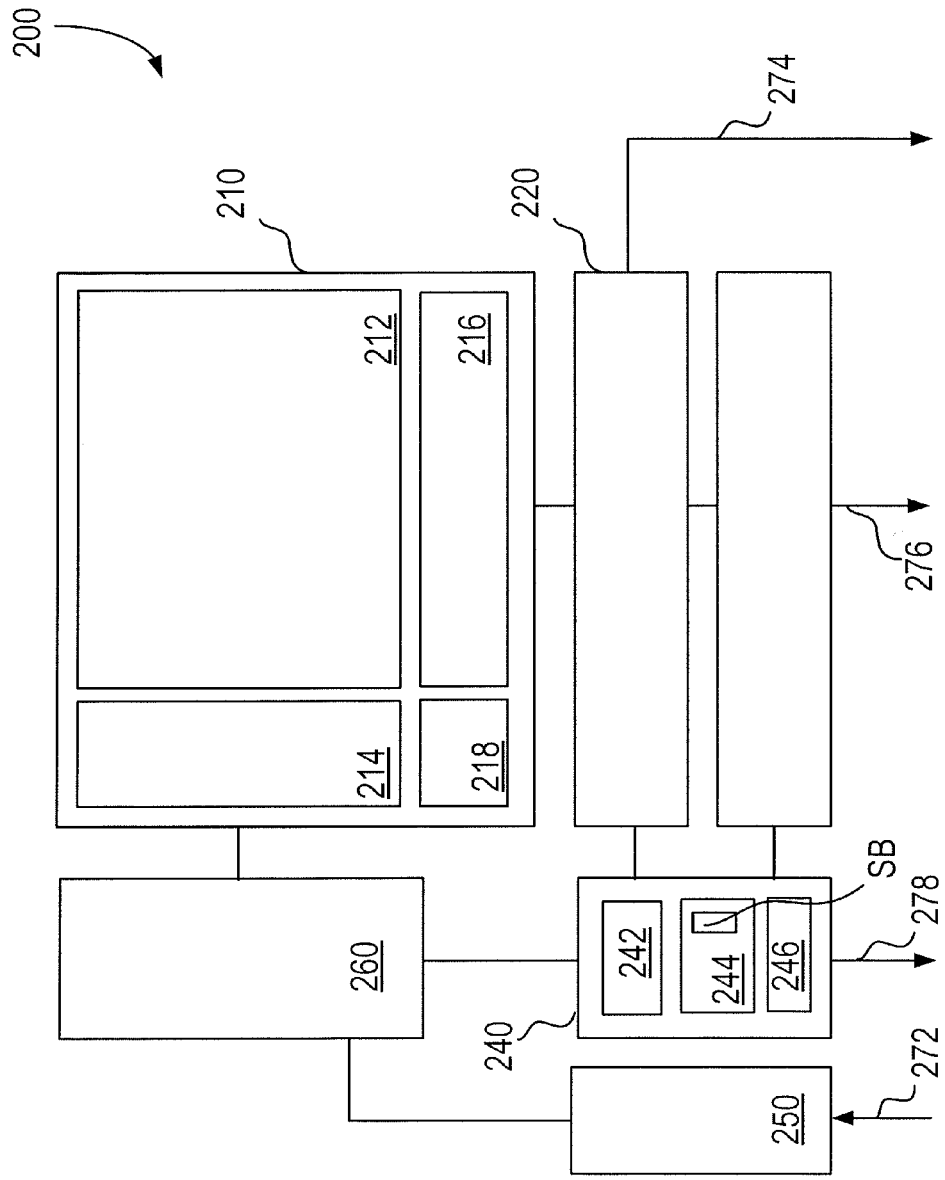
FIG. 2 is a block diagram of a memory macro in accordance with some embodiments.

FIG. 2 is a block diagram of a memory macro 200 in accordance with some embodiments. In some embodiments, the memory macro 200 is usable as the memory macro 126 in FIG. 1. Memory macro 200 includes a memory unit 210, an Error Correction Code (ECC) engine 220 coupled to the memory unit, a corrected data cache 230 coupled to the ECC engine, a self-repair unit 240 coupled to the ECC engine and the corrected data cache, a global control logic 250 coupled to the self-repair unit, and a local control logic 260 coupled to the global control logic and the self-repair unit.

Global control logic 250 and local control logic 260 collectively manage and control the operation of the memory macro 210. For example, global control logic 250 receives command and address information from a circuit outside memory macro 200, such as the processor 122, through interface 272. Global control logic 250 then sends the address information and/or the command to the local control logic 260 and the self-repair unit 240 for further processing in accordance with the present disclosure.

Memory unit 210 includes a memory array 212, an error-tag (ET) memory 214, a redundancy memory 216, and an ET redundancy memory 218. Memory array 212 and redundancy memory 216 includes memory cells arranged in rows and columns and are used to store rows of user data. ET memory 214 and ET redundancy memory 218 are used to store error-tag information of corresponding rows of user data. In some embodiments, user data and error-tag information are protected by parity bits and/or an ECC coding. In some embodiments, memory array 212 includes more than one set of memory array and/or its corresponding ET memory 214. In some embodiments, memory array 212 further includes sense amplifiers, word lines, bit lines, or the like.

Redundancy memory 216 includes memory cells used to repair erroneous memory cells in memory array 212 and/or redundancy memory 216. Redundancy memory 216 in some applications is also called as row redundancy memory.

In some embodiments, memory array 212, ET memory 214, redundancy memory 216, and/or ET redundancy memory 218 are not physically separated from one another. Rather, in some embodiments, memory array 212, ET memory 214, redundancy memory 216, and/or ET redundancy memory 218 are virtual memory spaces defined on one or more physical memory arrays. Moreover, different locations of memory array 212, ET memory 214, redundancy memory 216, and ET redundancy memory 218 are within the scope of various embodiments. In some embodiments, memory cells of ET memory 214 and ET redundancy memory 218 are positioned in an interleaving manner with the memory cells or words (i.e., a group of predetermined number of memory cells) of memory array 212 and redundancy memory 216. In some embodiments, each memory cell of the ET memory 214 and ET redundancy memory 218 is positioned adjacent to corresponding memory cells or words of memory array 212 and redundancy memory 216. In some embodiments, error-tag information and user data are coded and processed concurrently ECC engine 220 encodes inbound data for storing to memory unit 210 and/or decodes and corrects outbound data read from memory unit 210. When memory unit 210 is accessed, the data and associated parity bits are sent to ECC engine 220, and ECC engine 220 determines if an error is present. In some embodiments, if an error in memory unit 210 is recognized by ECC engine 220, ECC engine indicates the address of the error. In some embodiments. ECC engine 220 is also capable of outputting an "ECC Flag" indicating the presence of the error, read data from memory unit 210, and/or corrected data through interface 274.

In some embodiments, ECC engine 220 uses six parity bits to correct a single error in a data word of 32 bits and uses seven parity bits to correct a single error and detect a double error. In some embodiments, ECC engine 220 is capable of single error correction dual error detection (SECDED). In some embodiments, SECDED is implemented using Hamming code. In some embodiments, ECC engine 220 is capable of dual error correction dual error detection (DECDED). In various embodiments, ECC engine 220 is defined by the SoC designer, and is therefore suitable for use with different data widths of a design choice. Other ECC algorithms on which the implementation of the ECC engine is based are within the scope of various embodiments.

Examples of errors include soft errors and hard errors. Soft errors refer to errors that basically occur randomly and are unlikely to repeat in the same location multiple times. Hard errors refer to errors that repetitively occur in the same location.

Corrected data cache 230 stores corrected data from ECC engine 210. In some embodiments, corrected data cache 230 includes one or more rows of memory cells, and each row of the corrected data cache 230 has a similar length and arrangement as that of the memory unit 210. In some embodiments, each row of the memory cells of corrected data cache 230 is used to store a row of user data and corresponding error-tag information. In some embodiments, corrected data cache 230 is also capable of outputting corrected data received from ECC engine 220 through interface 276. In some embodiments, corrected data cache 230 includes at least one memory word configured to store a repair word.

A capacity of corrected data cache 230 is selected based on a predicted frequency of errors, an expected number of repair opportunities during operation of memory unit 210, a frequency of access of a same address in memory unit 210, a size of memory array 212, and/or a quality of a manufacturing process used to create memory macro 200. As the capacity of corrected data cache 230 increases, the number of errors the corrected data cache can store between repairs increases; however, the size of the corrected data cache also increases. To compensate for a higher predicted frequency of errors, the capacity of corrected data cache 230 is increased. As the number of expected repair opportunities during operation of memory unit 210 increases, the capacity of corrected data cache 230 is decreased because the corrected data cache will have more opportunities to repair errors in the memory unit 210. Similarly, as the frequency of accessing the same address in memory unit 210 increases, the capacity of corrected data cache 230 is decreased because the number of opportunities to repair errors increases. A larger memory array will have a higher likelihood of more errors than a smaller memory array. Therefore, as the size of memory array 212 increases, the capacity of corrected data cache 230 also increases. The quality of the manufacturing process relates to the predicted frequency of errors. As the quality of the manufacturing process improves, the predicted frequency of errors decreases. In some embodiments, the capacity of corrected data cache 230 ranges from 1 repair per mega-byte (MB) of memory in memory array 212 to 4 repairs per MB of memory in memory array 212.

In some embodiments, where a predicted frequency of errors is sufficiently small, redundancy memory 216 and corresponding ET redundancy memory 218 are omitted, and repairs for hard errors are stored in corrected data cache 230. In some embodiments where redundancy memory 216 and corresponding ET redundancy memory 218 are omitted, the capacity of corrected data cache 230 is increased to account for withholding corrected data for hard errors.

Redundancy unit 240 includes a redundant engine 242, a self-repair address comparator 244, and a cache stack counter 246. Redundant unit 240 is responsible for comparing addresses for accessing memory unit 210 with known faulty locations in memory unit 210, in order to redirect those accesses to redundant or spare locations in redundancy memory 216 assigned to replace the known faulty locations.

In some embodiments, redundant unit 240 stores the address of the faulty locations. When an error occurs during operation, for example, self-repair address comparator 244 recognizes the faulty location, and redundant engine 242 controls and identifies a corresponding alternative address of a redundancy location used to repair that faulty location. Once the redundancy location has been repaired (i.e., corrected data has been written into the redundancy location), redundancy engine 242 is capable of redirecting the next access to the faulty location to the corresponding redundancy location.

In some embodiments, status of each repair word in corrected data cache 230 is indicated by a corresponding status bit SB located in self-repair address comparator 244. For example, if a status bit SB has a high logical value, the corresponding repair word in corrected data cache 230 stores corrected data that has not been written back to a corresponding location in the memory unit 210. If a status bit SB has a low logical value, the data stored in the corresponding repair word is no longer needed, and the repair word is reusable.

Self-repair address comparator 244 is configured to receive address information from global control logic 250. Self-repair address comparator 244 compares the address with addresses to be repaired using corrected data cache 230. If self-repair address comparator 244 finds no match, global control logic 250 continues to executing an access command normally, i.e., assuming no error at the accessed memory location. If self-repair address comparator 244 finds a match, the self-repair address comparator checks the status bit SB associated with a corresponding repair word in corrected data cache 230. If status bit SB indicates that the repair is pending, the self-repair engine 242 then manages the access and/or repair accordingly as further explained below. In some embodiments, self-repair engine 242 is used to insert and remove addresses for repair in self-repair address comparator 244.

Cache stack counter 246 is configured to determine the number of rows or words of memory cells in corrected data cache 230 is occupied by corrected data. In some embodiments, cache stack counter 246 determines the number of pending repairs in corrected data cached 230 based on a number of status bits SB having high logic values. If the number of pending repairs is equal to the capacity of corrected data cache 230, cache stack counter 460 outputs a "cache full" signal through interface 278 indicating the corrected data cache is full. In some embodiments, cache stack counter 246 is configured to output a warning signal prior to the number of pending repairs being equal to the capacity of corrected data cache 230. In some embodiments, cache stack counter 246 outputs the warning signal when the number of pending repairs is within a predetermined number of repairs of the capacity of corrected data cache 230. The predetermined number is selected based on criteria similar to the selection of the capacity of corrected data cache 230.

In some embodiments, when a memory cell in memory array 212 has a hard error, a row in redundancy memory 216 is used in place of the row in memory array 212 that contains the erroneous memory cell. For example, if a memory cell has an error and is accessed, self-repair engine 242 redirects accessing of the erroneous memory row in memory array 212 to a corresponding row in redundancy memory 216. Further, if a memory cell in a row of redundancy memory 216 has a hard error, another row in redundancy memory 216 is used in place of the row of redundancy memory 216 that contains the erroneous memory cell. Self-repairing a redundancy row in redundancy memory 216 is similar to self-repairing a row in memory array 212.

In some embodiments, a "redundancy memory full" signal is output by the redundancy unit 240 to indicate that all redundancy rows in redundancy memory 216 have been used, and no additional hard errors can be recovered. In other words, the full signal indicates that memory unit 210 has made all the repairs of which memory unit 210 is capable. In some embodiments, subsequent hard errors are still recoverable using the corrected data cache 230 and/or other storage units outside memory macro 200.

Methods of Self-Repairing Using a Cache

Figure 3:
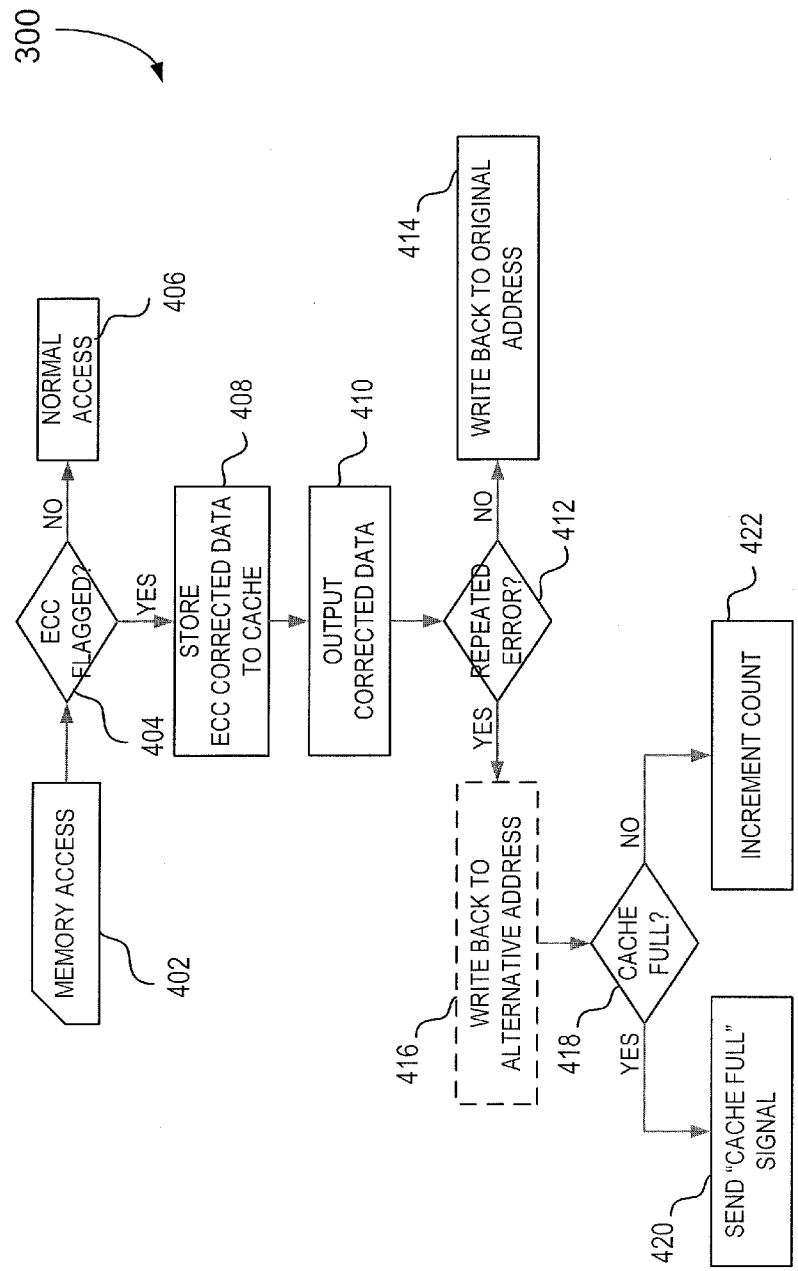
FIG. 3 is a flowchart of a method of repairing a memory failure in a memory macro in accordance with some embodiments.
Figure 4:
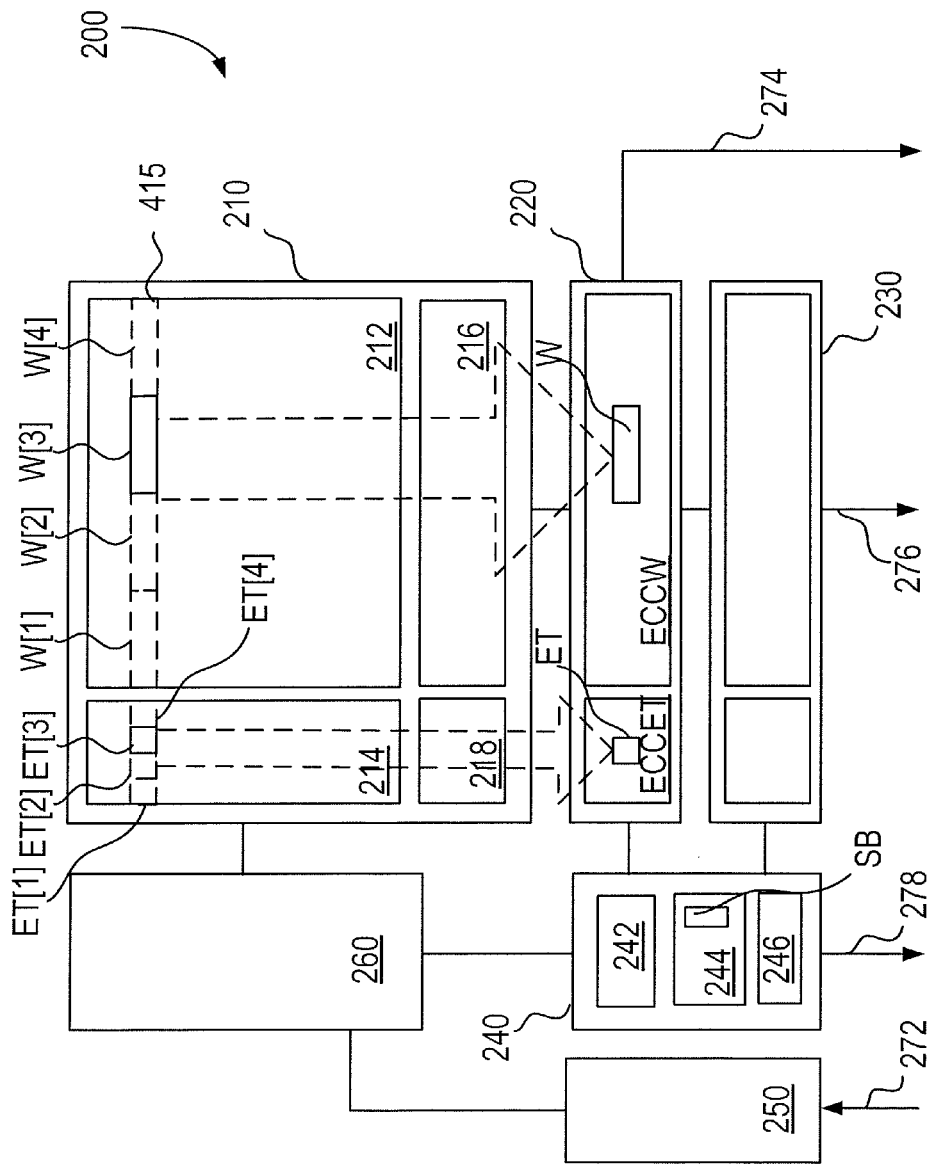
FIGS. 4-9 are block diagrams of a memory macro at various stages of operation in accordance with some embodiments.

FIG. 3 is a flowchart of an example method 300 of repairing a memory failure in a memory macro in accordance with some embodiments. FIGS. 4-9 are block diagrams of a memory macro 200 at various stages of operation in accordance with some embodiments. It is understood that additional operations may be performed before, during, and/or after the method 300 depicted in FIG. 3, and that some other processes may only be briefly described herein. In some embodiments, one or more of the operations depicted in FIG. 4 are omitted.

As depicted in FIG. 4, for illustration, one row 415 of memory cells is shown in memory array 212. A row of memory cells includes a plurality of memory words. For illustration, row 415 is shown having four words labeled words W[1], W[2], W[3], and W[4]. In some embodiments, common numbers of words W in a row include 8, 16, 32, 64, etc. A different number of words in a row of memory cells is within the scope of various embodiments. Each word includes a plurality of memory cells or memory bits. In at least one embodiment, a word including eight bits.

Also, as an example, ET memory 214 includes four error tag (ET) bits ET[1], ET[2], ET[3], and ET[4] corresponding to four words W[1], W[2], W[3], and W[4], respectively. When the number of words in a row of memory changes, the number of error tag bits changes accordingly. For example, if N represents an integer, and if there are N number of words W[1] to W[N], there are N number of ET bits ET[1] to ET[N].

In some embodiments, each error tag bit defaults to a logical low value indicating there is no soft error previously identified in any of the corresponding word. When a memory cell in a word has been identified to have a soft error, the corresponding ET bit is set to a high logical value. Other values in ET bits indicating the erroneous states of the corresponding words are within the scope of various embodiments.

As depicted in FIG. 3 and FIG. 4, in operation 402, a memory access is performed. The memory access begins with receipt of address information and access command by global control unit 250. In some embodiments, address information and access command are transmitted from circuitry external to the memory macro 200. If the command is a read operation, global control logic 250 sends the address information to redundancy unit 240, and redundancy unit 240 determines if local control logic 260 needs to be set to redirect the access to redundancy memory 216. In the embodiment depicted in FIG. 4, local control logic 260 is not set to redirect the access to redundancy memory 216.

The data stored in the corresponding address of memory array 212 or redundancy memory 216, such as word W[3] in row 415, is output to ECC engine 220 for decoding and/or error correction. ECC engine 220 determines whether an error is present in the read out data based. In some embodiments, the data bits in corresponding ET memory 212 or ET redundancy memory 218, such as ET[3] in row 415, are also sent to ECC engine 220.

ECC engine 220 includes a word logic engine ECCW and an error-tag logic engine ECCET. Word logic engine ECCW is used to process a word, such as, a word W[1], W[2], W[3], or W[4]. For example, when a word is accessed, the binary value of word and parity bits are provided to word logic engine ECCW, which, in some embodiments, based on Hamming code technique, identifies a bit in word that has flipped. Engine ECCW also flips the erroneous bit to provide the corrected data for the erroneous word. Effectively, engine ECCW determines whether an error has occurred in word W, and if the error occurs, engine ECCW provides the corrected data. Hamming ECC code technique is used for illustration. Other ECC techniques are within the scope of various embodiments.

Error-tag logic engine ECCET is used to process each ET bit, such as each of four bits ET[1] to ET[4]. In some embodiments, engine ECCET is a comparator providing a result to indicate whether the accessed ET bit is logically high or logically low. For example, if the accessed ET bit has a high logical value, engine ECCET provides a result having a logical high value. Effectively, engine ECCET indicates that the word W corresponding to the bit ET has had an error previously. In contrast, if the accessed ET bit has a low logical value, engine ECCT provides the result having a logical low value. Effectively, engine ECCET indicates that the word W corresponding to the accessed bit ET had no previous error.

For another example, the high logical value from engine ECCET and a logical high value of "ECC Flag" signal indicate that the error in the word W corresponding to the accessed bit ET is a hard error. In the embodiments in which bits ET are co-located with their respective words W, engine ECCET is part of engine ECCW. Effectively, ECC engine 220 decodes and detects error before evaluating corresponding ET bits.

In operation 404, whether an "ECC Flag" is generated during accessing an address on memory unit 415 is determined. In some embodiments, the determination is made by ECC engine 220. ECC engine 220 determines whether an error in the data stored at the address occurred and generates a flag in response to the error.

Figure 5:
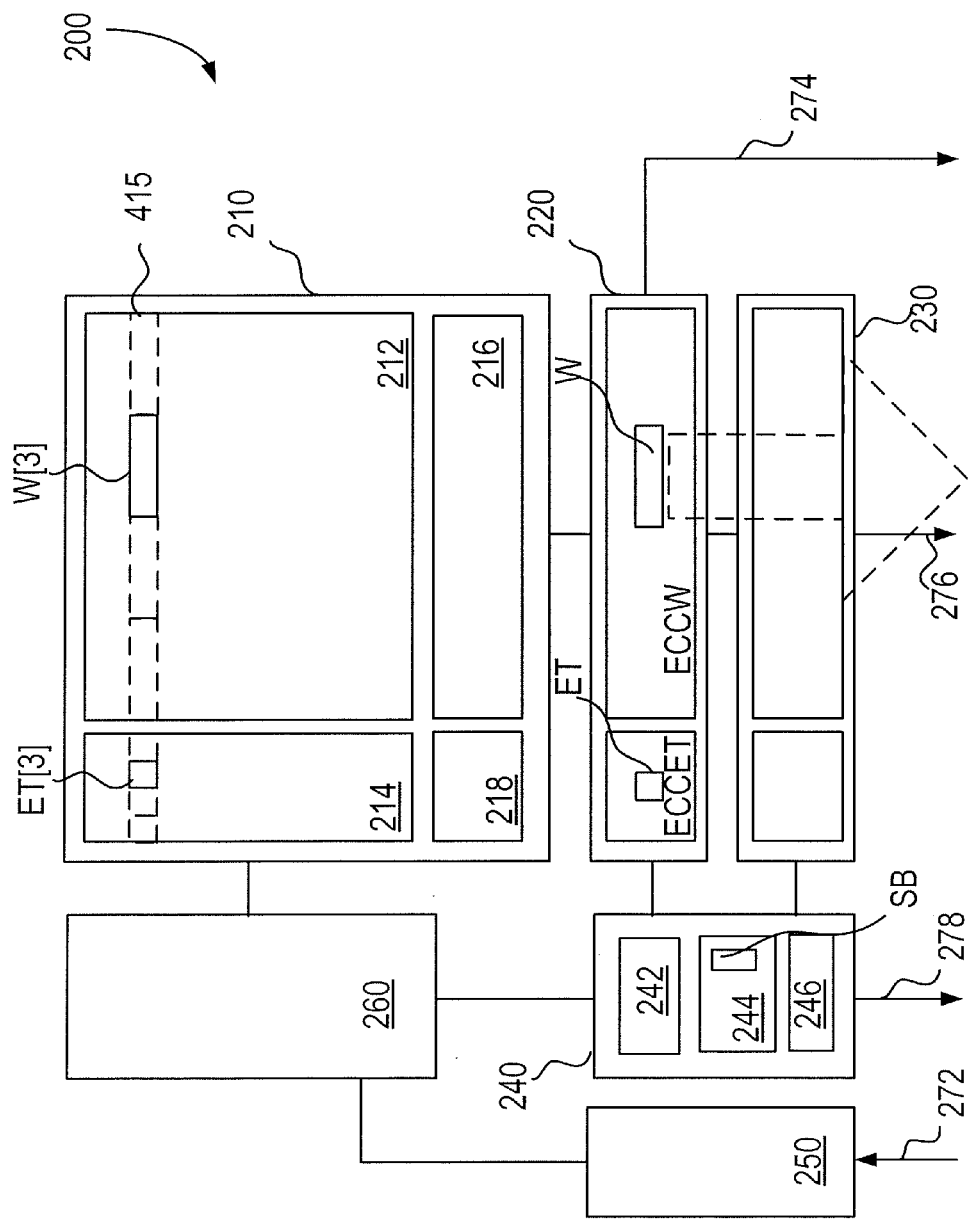

As depicted in FIG. 3 and FIG. 5, in operation 406, if no "ECC Flag" is generated, the memory macro 200 is accessed normally. In some embodiments, the word W[3] as decoded by ECC engine 220 is output through interface 274.

Figure 6:
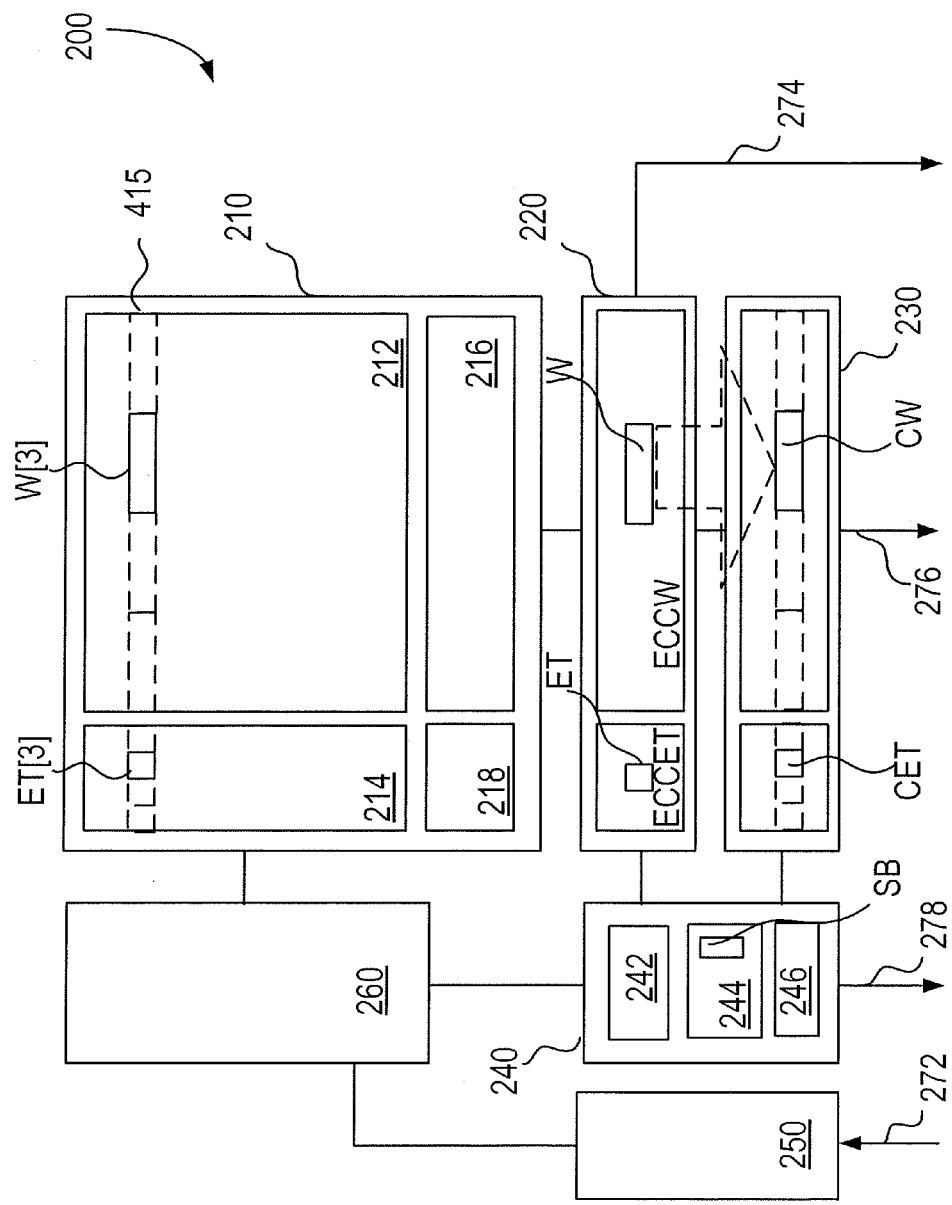

As depicted in FIG. 3 and FIG. 6, in operation 408, if "ECC Flag" is generated, corrected data generated by ECC engine 220 is stored in corrected data cache 230. An address tag is associated with the corrected data and added to self-repair address comparator 244. In some embodiments, the corrected data is added to corrected data cache 244 and managed as a stack. In some embodiments, the corrected data is added to corrected data cache 244 and managed as a queue. In some embodiments, the corrected data is added to corrected data cache 244 in a random manner. In some embodiments, status bit SB associated with the corrected data is set to a high logical value.

For example, as depicted in FIG. 6, corrected data cache 230 includes at least one memory word configured to store a repair word CW. In some embodiments, corrected data cache 230 includes a plurality of memory cells each configured to store a repair word CW. Corrected data cache 230 further includes a cache error tag CET associated with a repair word CW stored in the corrected data cache. In operation, if ECC engine 220 detects an error in output data from memory array 212 or redundancy memory 216, ECC engine 220 corrects the output data and transmits the corrected data to corrected data cache 230. The corrected data is then stored as repair word CW for later repair of memory array 212 or redundancy memory 216. Once the corrected data is stored in corrected data cache 230, cache error tag CET corresponding to repair word CW is reset to a low logical value.

Each repair word CW is also associated with a corresponding status bit SB located in a self-repair address comparator 244, such that a number of status bits SB is equal to a number of repair words CW of corrected data cache 230. Status bit SB associated with each repair word CW indicates the status of the repair stored in repair word CW. For example, if status bit SB has a high logical value, the repair stored in repair word CW has not been performed. If status bit SB has a low logical value, the repair stored in repair word CW has been repaired, and the repair word can be over-written with new information. Status bit SB corresponding to repair word CW is reset to a low logical value when the repair is performed. In some embodiments, status bit SB is reset by self-repair engine 242.

Figure 7:
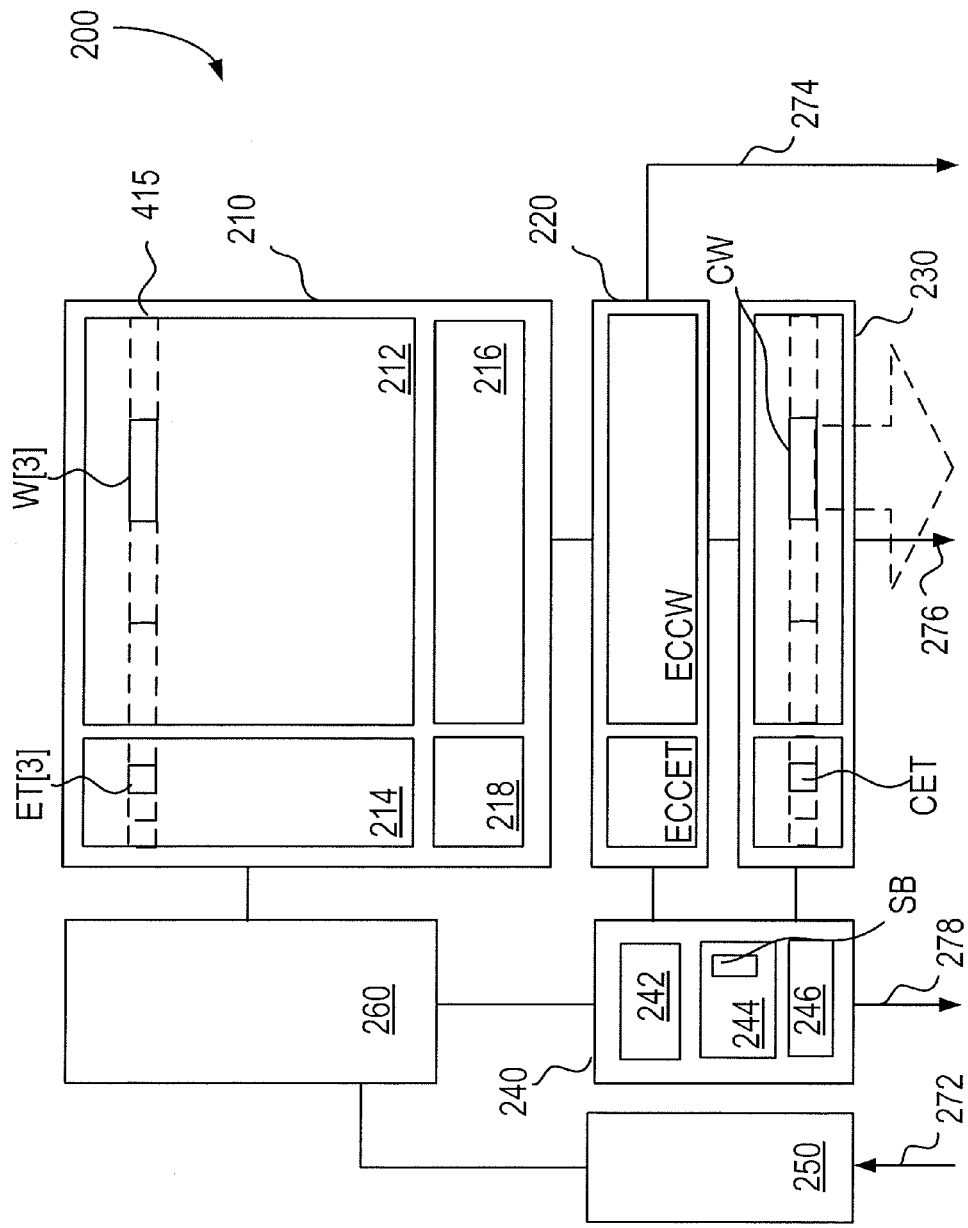

As depicted in FIG. 3 and FIG. 7, in operation 410, corrected data is output to external circuitry. In some embodiments, corrected data is output by ECC engine 220. In some embodiments, corrected data is output by corrected data cache 230. In some embodiments, the "ECC Flag" is output by ECC engine 220. In some embodiments, the "ECC Flag" is output to self-repair unit 240. Also, in operation 410, a "Repeat Error Flag" is set based on the decoded bit ECCET and the "ECC Flag." The "Repeat Error Flag" is set so that any subsequent error at a same address is determined to be a hard error. For example, a high logic value in ECCET indicates that a soft error with respect to word W[3] occurred before; and the "ECC Flag" further indicates that word W[3] has a decoded error again, and word W[3] thus is considered to contain a hard error. In some embodiments, the "Repeat Error Flag" is set using self-repair engine 242.

In step 412, whether the error is a repeat error at the same location is determined. In some embodiments, the determination is performed by self-repair engine 242 and/or self-repair address comparator 244. In some embodiments, a comparison is made between the address associated with the "ECC Flag" and addresses at which an error previously occurred. If the comparison results in a match, the error is determined to be a hard error. If the comparison results in no match, the error is determined to be a soft error.

Figure 8:
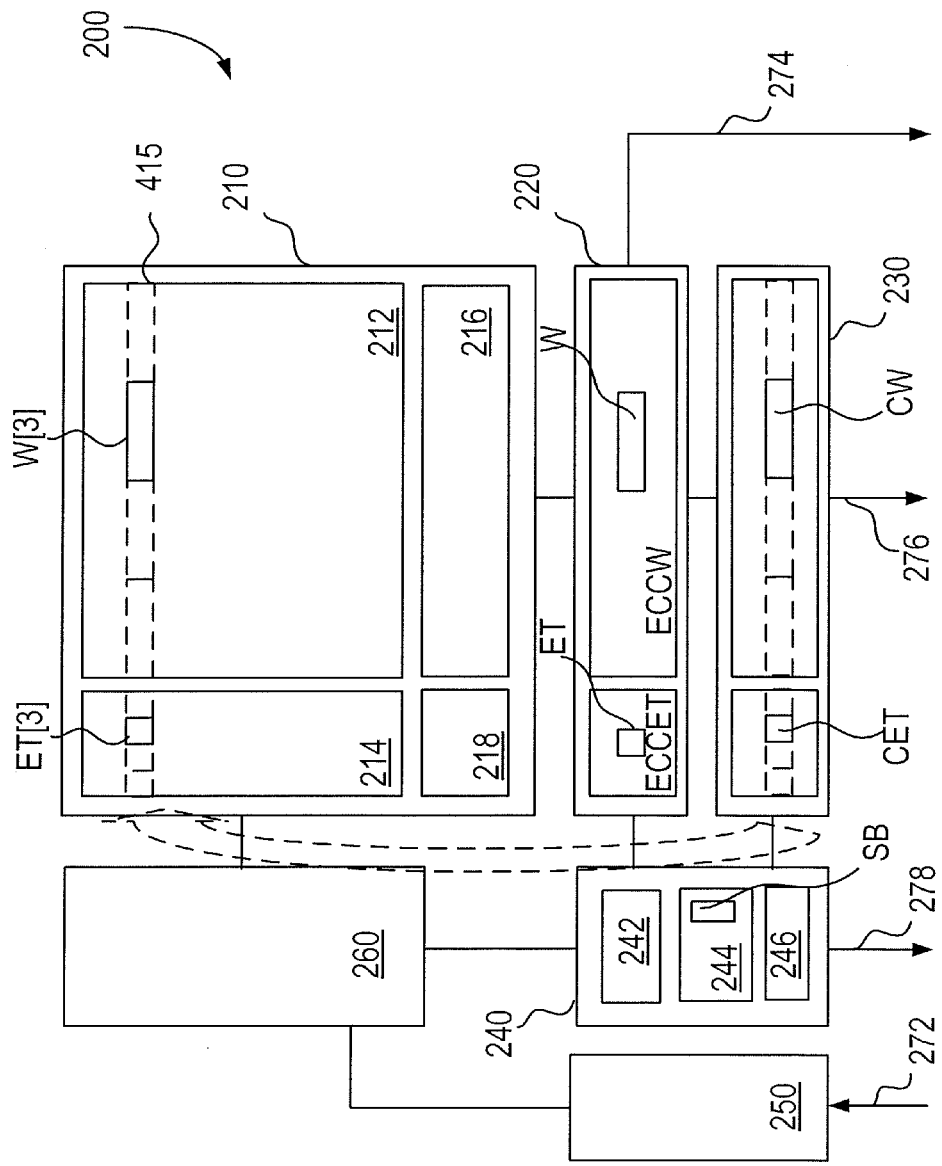

As depicted in FIG. 3 and FIG. 8, in operation 414, if the error is determined to be a soft error, the corrected data is written back to the associated original address in memory array 212 or redundancy memory 216 during a non-blocking cycle. Also in operation 414, a high logical value is set in bit ET[3] indicating that an error has occurred in any one bit of word W[3]. Further, if an error occurs again in word W[3], the high logical value in bit ET[3] together with the recurrence of the error indicates that the error is a hard error.

In some embodiments, memory array 212 or redundancy memory 216 are considered blocked when a circuit or system having a higher priority than corrected data cache 230 is accessing the respective memory. In some embodiments, the corrected data is written back during an NOP. In some embodiments, the corrected data is written back during a refresh operation. In some embodiments, the repair occurs when the address needing repair is accessed. In some embodiments, the repair occurs during a refresh cycle of the respective memory.

In some embodiments, during a read operation concerning an address corresponding to a pending repair word CW in corrected data cache 230, global control 250 manages to repair word CW of corrected data cache 230. The information stored in the repair word CW is output to external circuitry. In some embodiments, corrected data cache 230 treats the read operation as a NOP and performs a "hidden write" to repair the error corresponding to the accessed repair word CW. Corrected data cache 230 writes the repair word CW to the corresponding address in memory array 212 and the status bit SB associated with the repair word is changed to a low logical value. In some embodiments, corrected data cache 230 does not perform the "hidden write" and waits for a NOP repair the error in the memory array 212.

In some embodiments, during a write operation concerning an address corresponding to a pending repair word CW in corrected data cache 230, global control 250 manages to directly write the received data to the address, and the writing operation effectively repairs the error. The status bit SB corresponding to the repair word CW associated with the accessed memory cell in memory array 212 is changed to a low logical value indicating that the repair is completed.

In some embodiments, during a refresh operation concerning an address corresponding to a pending repair word CW in corrected data cache 230, global control 470 manages to cause the corrected data cache 230 to write the corrected data in word CW to the address in memory array 212. In some embodiments, corrected data cache 230 treats the refresh operation as a NOP and performs the "hidden write" to repair the error corresponding to the accessed repair word CW. Also, the status bit SB associated with the repair word CW is changed to a low logical value. In some embodiments, corrected data cache 230 does not perform the "hidden write" and waits for a NOP repair the error in the memory array 212. Corrected data cache 230 does not output information during a refresh operation.

In some embodiments, during an NOP, corrected data cache 230 writes data to memory array 212 or redundancy memory 216 to correct soft errors or hard errors.

In some embodiments, pending repairs are performed in a first-in-first-out (FIFO) scheduling arrangement. In some embodiments, pending repairs are performed in a last-in-first-out (LIFO) scheduling arrangement. In some embodiments, pending repairs are performed in an arbitrary scheduling arrangement.

Figure 9:
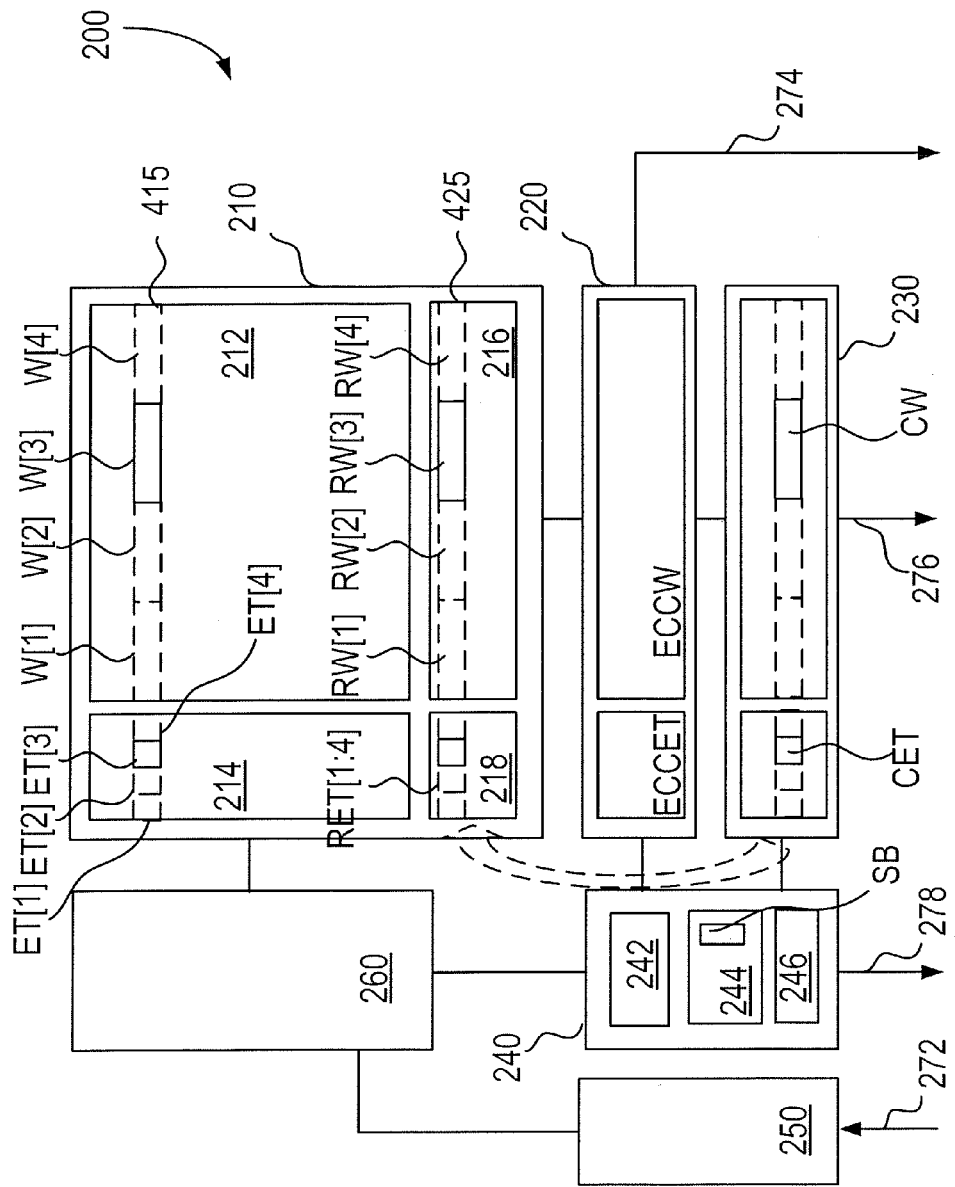

As depicted in FIG. 3 and FIG. 9, in operation 416, if the error is determined to be a hard error, the corrected data is written back to redundancy memory 216. Redundancy memory 216 includes a row 425 of redundancy memory 216 is shown in FIG. 9 as an example. In at least one embodiment, the number of words in a row of redundancy memory 216 is consistent with the number of words in a row of memory array 212. For example, row 425 is shown having four words RW[1], RW[2], RW[3], and RW[4] corresponding to four words W[1], W[2], W[3], and W[4] of memory array 212, respectively. If the number of words in a row of memory array 212 changes, the number of words in a row of redundancy memory 216 changes accordingly. The number of redundancy rows in redundancy memory 216 varies depending on application and design choice, taking account of various factors including, for example, the expected lifetime of memory macro 200, the estimated number of failures in the lifetime, etc.

ET redundancy memory 218 includes error-tag bits corresponding to memory words in row redundancy memory 216. As illustratively shown in FIG. 9, ET redundancy memory 216 includes four bits RET[1:4] corresponding to four words RW[1], RW[2], RW[3], and RW[4], respectively. When the number of words RW in a row changes, the number of bits RET changes accordingly. In some embodiments, error-tag bits RET[1], RET[2], RET[3], and RET[4] and words RW[1], RW[2], RW[3], and RW[4] are arranged in a manner similar to that of error-tag bits ET[1], ET[2], ET[3], and ET[4] and words W[1], W[2], W[3], and W[4].

In some embodiment, repairing a hard error is performed in a manner similar to repairing a soft error described in conjunction with operation 914, except an alternative address directing to a designated replacement row in redundancy memory 216 is used. In some embodiments, the corrected data is written back using a hidden write process. In some embodiments, the corrected data is written back during an NOP. In some embodiments, the corrected data is written back during a refresh operation. Also in operation 416, the write back address in redundancy memory 216 replaces the associated address in memory array 212. In some embodiments, self-repair engine 440 performs the address replacement. Also in operation 416, a "Repeat Error Flag" with regard to word RW[3] is reset. The "Repeat Error Flag" is reset so that an initial error at the redundancy memory address (e.g., word RW[3]) is determined to be a soft error. In some embodiments, the repeat error flag is reset using self-repair engine 242.

In some embodiments, the memory unit 210 either does not have redundancy memory 216 or redundancy memory 216 has no more space available for any future hard error, operation 416 is omitted, and the hard error is handled by the corrected data cache 230.

As depicted in FIG. 3, in operation 418, corrected data cache 230 is examined to determine whether the corrected data cache is full. In some embodiments, the determination is performed by cache stack counter 246.

In operation 418, if corrected data cache 230 is determined to be full, a "Cache Full" signal is transmitted to external circuitry. In some embodiments, upon receipt of "Cache Full" signal, an NOP cycle is provided for the memory macro 200 to provide an opportunity for corrected data cache 230 to write back at least one stored repair.

In operation 418, if corrected data cache 230 is determined not to be full, a repair count is increased by one. In some embodiments, the repair count is stored in cache stack counter 246. In some embodiments, a warning signal is transmitted to external circuitry when a number of repairs stored in corrected data cache 230 exceed a threshold value.

The above methods include exemplary operations, but the operations are not necessarily performed in the order shown. Operations may be added, replaced, changed order, and/or eliminated as appropriate, in accordance with the spirit and scope of disclosed embodiments.

One aspect of this disclosure relates to a memory array has a plurality of rows including a plurality of memory words. Each first bit of a plurality of first bits is associated with a memory word of the each row. A state of the each first bit indicates whether the associated memory word has had an error. Each redundancy row of a plurality of redundancy rows includes a plurality of redundancy words. Each redundancy word is associated with a memory word. A corrected data cache has at least one repair word configured to store corrected data and at least one status bit associated with the at least one repair word, the status bit indicating whether the corrected data stored in the repair word is a pending repair. The corrected data cache is configured to write the corrected data stored in the repair word to at least one of a counterpart memory word or a counterpart redundancy word.

Another aspect of this disclosure relates to a computing device including a processor connected to a memory array that has a plurality of rows including a plurality of memory words. Each first bit of a plurality of first bits is associated with a memory word of the each row. A state of the each first bit indicates whether the associated memory word has had an error. Each redundancy row of a plurality of redundancy rows includes a plurality of redundancy words. Each redundancy word is associated with a memory word. A corrected data cache has at least one repair word configured to store corrected data and at least one status bit associated with the at least one repair word, the status bit indicating whether the corrected data stored in the repair word is a pending repair. The corrected data cache is configured to write the corrected data stored in the repair word to at least one of a counterpart memory word or a counterpart redundancy word.

Another aspect of this disclosure relates to a method of operating a memory. The method includes detecting an error which occurs during accessing an address in a memory array. The method further includes correcting data corresponding with the detected error. The method further includes storing the corrected data in a corrected data cache. The method further includes associating the corrected data with the address in the memory array. The method further includes outputting the corrected data to circuitry external to the memory. The method further includes determining whether the error is a hard error or a soft error. The method further includes writing the corrected data stored in the corrected data cache back into the memory array if the error is a soft error.

A number of embodiments have been described. It will nevertheless be understood that various modifications may be made without departing from the spirit and scope of the disclosure.

What is claimed is:

1. A memory comprising:
    a memory array having a plurality of rows, each row of the plurality of rows of the memory array including a plurality of memory words;
    a plurality of first bits, each first bit of the plurality of first bits associated with a memory word of the plurality of memory words of the each row of the plurality of rows of the memory array, wherein a logic state of the each first bit indicates whether the memory word associated with the each first bit has had a failed bit;
    a plurality of redundancy rows, each redundancy row of the plurality of redundancy rows including a plurality of redundancy words, each redundancy word of the plurality of redundancy words associated with a corresponding memory word of the plurality of memory words of the each row of the plurality of rows of the memory array; and
    a corrected data cache having at least one repair word configured to store corrected data and at least one status bit associated with the at least one repair word, the status bit indicating whether the corrected data stored in the repair word is a pending repair, the corrected data cache configured to write the corrected data stored in the repair word to at least one of a counterpart memory word or a counterpart redundancy word.

2. The memory of claim 1, further comprising:
    a self-repair address comparator configured to compare an address associated with the corrected data and an address to be accessed.

3. The memory of claim 1, further comprising a cache stack counter configured to monitor a number of pending repairs in the corrected data cache.

4. The memory of claim 1, wherein the corrected data cache is configured to have a maximum number of pending repairs ranging from 1 to 4 per mega-byte (MB) of memory array.

5. The memory of claim 1, further comprising:
    a word logic engine configured to process each memory word of the plurality of memory words of a row of the memory array; and
    a bit-tag logic engine configured to process the each first bit associated with the each memory word of the plurality of memory words to be processed.

6. The memory of claim 1, further comprising an error correct engine configured
    to cause a change in the state of the each first bit based on an error in the memory word associated with the each first bit and write the memory word with the changed bit into the corrected data cache as the corrected data; and/or
    to cause a change in the state of the each second bit based on an error in the redundancy word associated with the each second bit and write the redundancy word with the changed bit into the corrected data cache as the corrected data.

7. The memory of claim 1, further comprising an error correction engine configured
    to generate an error-repair flag based on the state of the each first bit and an error in the memory word associated with the each first bit; and/or
    to generate the error-repair flag based on the state of the each second bit and an error in the redundancy word associated with the each second bit.

8. A computing device comprising:
    a processor; and
    a memory macro connected to the processor comprising:
        a memory array having a plurality of rows, each row of the plurality of rows of the memory array including a plurality of memory words;
        a plurality of first bits, each first bit of the plurality of first bits associated with a memory word of the plurality of memory words of the each row of the plurality of rows of the memory array, wherein a logic state of the each first bit indicates whether the memory word associated with the each first bit has had a failed bit;
        a plurality of redundancy rows, each redundancy row of the plurality of redundancy rows including a plurality of redundancy words, each redundancy word of the plurality of redundancy words associated with a corresponding memory word of the plurality of memory words of the each row of the plurality of rows of the memory array; and
        a corrected data cache having at least one repair word configured to store corrected data and at least one status bit associated with the at least one repair word, the status bit indicating whether the corrected data stored in the repair word is a pending repair, the corrected data cache configured to write the corrected data stored in the repair word to at least one of a counterpart memory word or a counterpart redundancy word.

9. The computing device of claim 8, further comprising:
    a self-repair address comparator configured to compare an address associated with the corrected data and an address to be accessed.

10. The computing device of claim 8, further comprising a cache stack counter configured to monitor a number of pending repairs in the corrected data cache.

11. The computing device of claim 8, wherein the corrected data cache is configured to have a maximum number of pending repairs ranging from 1 to 4 per mega-byte (MB) of memory array.

12. The computing device of claim 8, further comprising:
    a word logic engine configured to process each memory word of the plurality of memory words of a row of the memory array; and
    a bit-tag logic engine configured to process the each first bit associated with the each memory word of the plurality of memory words to be processed.

13. The computing device of claim 8, further comprising an error correct engine configured
    to cause a change in the state of the each first bit based on an error in the memory word associated with the each first bit and write the memory word with the changed bit into the corrected data cache as the corrected data; and/or
    to cause a change in the state of the each second bit based on an error in the redundancy word associated with the each second bit and write the redundancy word with the changed bit into the corrected data cache as the corrected data.

14. The computing device of claim 8, further comprising an error correction engine configured
    to generate an error-repair flag based on the state of the each first bit and an error in the memory word associated with the each first bit; and/or to generate the error-repair flag based on the state of the each second bit and an error in the redundancy word associated with the each second bit.

15. A method of operating a memory, the method comprising:
- detecting an error which occurs during accessing an address in a memory array;
- correcting data corresponding with the detected error;
- storing the corrected data in a corrected data cache;
- associating the corrected data with the address in the memory array;
- outputting the corrected data to circuitry external to the memory;
- determining whether the error is a hard error or a soft error; and
- writing the corrected data stored in the corrected data cache back into the memory array if the error is a soft error.

16. The method of claim 15, further comprising:
- checking a capacity status of the corrected data cache after storing the corrected data in the corrected data cache; and
- outputting a signal when a number of corrected data stored in the corrected data cache exceeds a threshold value.

17. The method of claim 15, further comprising:
- if the error is a hard error, writing the corrected data back into a redundancy memory; and
- associating the address in the memory array with an address of the corrected data in the redundancy memory.

18. The method of claim 15, further comprising:
- if the error is a hard error, permanently storing the corrected data in the corrected data cache; and
- directing a subsequent access of the address to the corrected data stored in the corrected data cache.

19. The method of claim 15, wherein writing the data back into the memory array comprises performing a hidden write operation.

20. The method of claim 15, wherein writing the data back into the memory array comprises writing back into the memory array during a cycle when the memory array is not accessed by external circuitry.

\* \* \* \* \*